United States Patent [19]

Ryczek

[11] Patent Number: 4,560,891
[45] Date of Patent: Dec. 24, 1985

[54] ON/OFF DELAY CIRCUIT

[75] Inventor: Lawrence J. Ryczek, Nashotah, Wis.

[73] Assignee: Eaton Corporation, Cleveland, Ohio

[21] Appl. No.: 509,950

[22] Filed: Jun. 30, 1983

[51] Int. Cl.[4] .................. H03K 5/13; H01M 47/18
[52] U.S. Cl. .................. 307/597; 307/247 R; 307/246; 361/196
[58] Field of Search ............... 307/590, 607, 247 R; 361/196, 975; 302/571, 246

[56] References Cited

U.S. PATENT DOCUMENTS

| | | | |
|---|---|---|---|
| 3,755,695 | 8/1973 | Krick et al. | 307/595 |
| 3,794,857 | 2/1974 | Milovancevic | 307/595 |
| 3,950,657 | 4/1976 | Sheng et al. | 307/593 |
| 4,047,058 | 9/1977 | Green | 307/595 |

Primary Examiner—Stanley D. Miller
Assistant Examiner—B. P. Davis
Attorney, Agent, or Firm—Andrus, Sceales, Starke & Sawall

[57] ABSTRACT

A delay circuit 2 utilizes two comparator timers 4 and 6 and a minimum of logic to achieve a combination ON/OFF delayed function. The comparator timers 4 and 6 are resettable independently of each other such that each respective ON or OFF delay function may begin retiming without waiting for the other delay function to time out if the input signal transitions back and forth before the end of the respective ON or OFF delay. The delayed circuit 2 is ideal for proximity switch applications, particularly photoelectric type proximity switches, for providing a delayed output signal following a given sensed condition.

17 Claims, 2 Drawing Figures

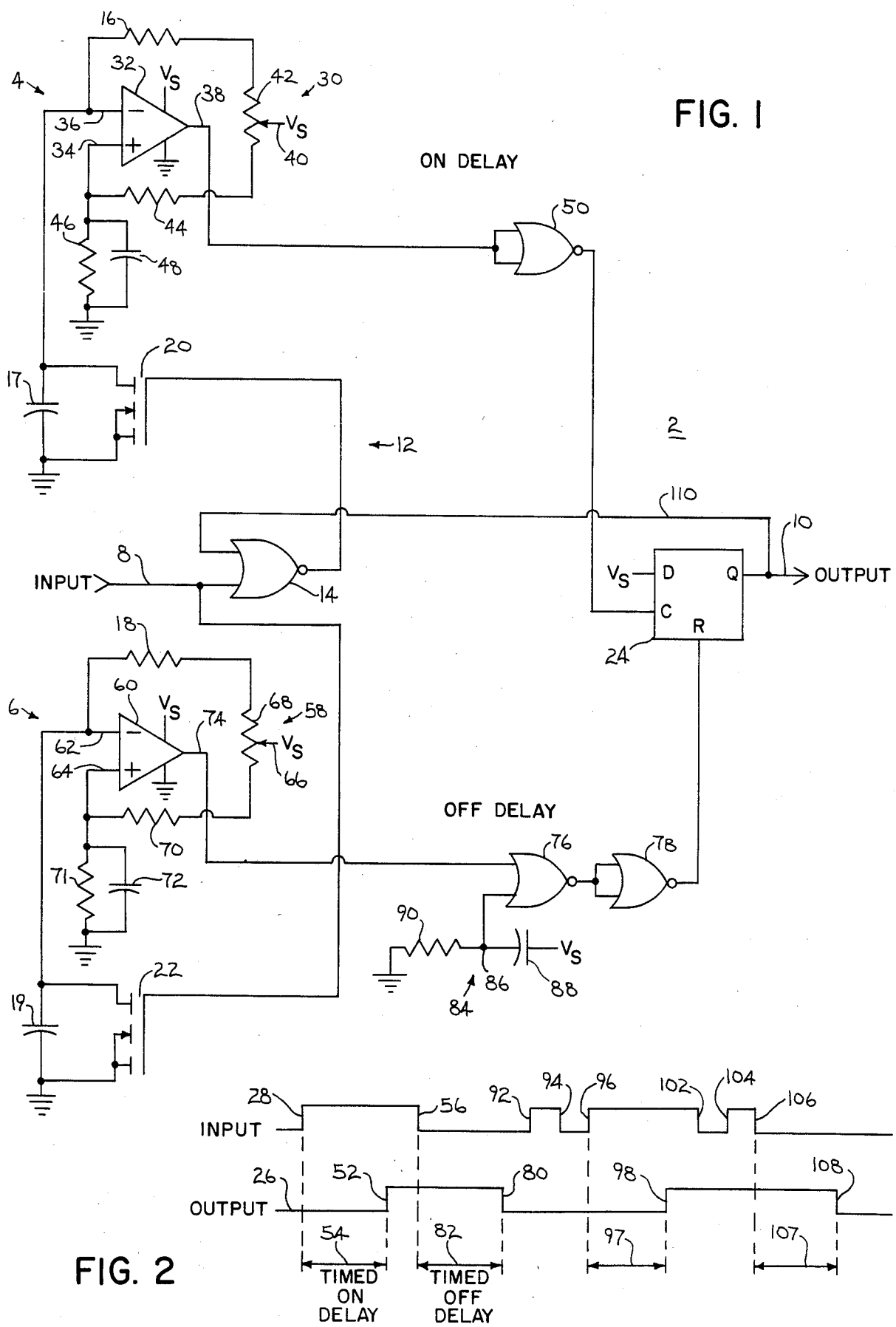

ON/OFF DELAY CIRCUIT

BACKGROUND AND SUMMARY

The invention provides a delay circuit utilizing two timers and a minimum of logic to achieve a combination ON/OFF delayed function. The output signal is used to inhibit the ON delay timer, and the circuit is fully resettable in both the ON delay and OFF delay modes.

The invention overcomes disadvantages of pivot delay circuits having an ON delay and OFF delay timer in series. In the series arrangement, each reset time is dependent on the other timer. For example, if the input signal switches ON-OFF-ON before the end of the first ON delay, the second or reset ON delay may have to wait until the end of the OFF delay before beginning retiming.

In the present invention, the timers may be reset independently of each other such that each respective ON or OFF delay function may begin retiming without waiting for the other delay function if the input signal changes states before the end of the respective ON or OFF delay.

The invention is characterized by expanded timing range, reduced power consumption and improved resolution. Though not limited thereto, the delay circuit was developed for proximity switches and is particularly useful in photoelectric type proximity switches for providing a delayed output signal following a given sensed condition. The wide range together with the low power consumption makes the circuit ideal for such proximity switch applications.

DESCRIPTION OF THE DRAWINGS

FIG. 1 is a circuit diagram of an ON/OFF delay circuit constructed in accordance with the invention. FIG. 2 is a timing diagram illustrating operation of the circuit of FIG. 1.

DETAILED DESCRIPTION

FIG. 1 shows a delay circuit 2 comprising first and second comparator timers 4 and 6 responsive to an input signal at input 8 and providing respective ON and OFF delays of an output signal at output 10. Means 12 is responsive to the output signal for inhibiting the ON delay function of comparator timer 4, such that circuit 2 is fully resettable in both the ON and OFF delays. Means 12 comprises a gate 14 having inputs from the input signal on line 8 and from the output signal on line 10, and having an output to comparator timer 4.

Means 12 is provided for resetting comparator timers 4 and 6 independently of each other such that each respective ON or OFF delay function may begin retiming without waiting for the other delay function if the input function changes states before the end of the respective ON or OFF delay.

The input signal initiates ON delay by the upper half of the circuit. If the input signal changes OFF before the end of the ON delay, the output at 10 remains OFF, and when the input signal changes back ON, the ON delay begins retiming without waiting for the OFF delay, regardless of whether the OFF delay time has expired.

An input OFF signal initiates OFF delay by the lower half of the circuit. If the input signal changes ON before the end of the OFF delay, the output at 10 remains ON, and when the input signal changes back OFF, the OFF delay begins retiming without waiting for the ON delay, regardless of whether the ON delay time has expired.

Each of the comparator timers 4 and 6 includes respective RC means 16, 17, and 18, 19. Resetting means 12 comprises first and second switch means 20 and 22, such as field effect transistors, responsive to the input signal for enabling and disabling charging of the respective capacitors. The first switch means 20 includes input gate 14 responsive to the input signal and to the output signal for controlling switch 20 to enable or disable charging of capacitor 17. An output gate 24, such as a flip-flop, is responsive to the comparator timers and outputs the output signal on line 10.

In operation, with the output signal initially low, as shown at 26, FIG. 2, an input signal transition 28 from low to high causes the output of NOR gate 14 to go low, which low state renders FET 20 nonconductive. The nonconductive state of FET 20 enables charging of capacitor 17 through resistor 16 from potentiometer 30.

First comparator 4 comprises an operational amplifier 32 having a reference input terminal 34, a comparing input terminal 36, and an output 38 whose state is determined by the state of the comparing input terminal 36 relative to the reference input terminal 34. Potentiometer 30 includes a wiper 40 connected to a variable point along pot resistor 42 for changing the charging current to capacitor 17, and for changing the reference voltage to terminal 34. If the wiper 40 is moved upwardly, the amount of charging current is increased to thus provide more rapid voltage rise at comparing input terminal 36, and the reference voltage at terminal 34 is decreased. If wiper 40 is moved downwardly, the reference voltage at terminal 34 is increased, and the charging current is decreased such that the voltage at terminal 36 does not rise as fast. When the voltage at comparing input terminal 36 rises above that at reference input terminal 34, output 38 transitions low.

The length of the delay until the voltage at terminal 36 rises above that at terminal 34 is determined by the setting of potentiometer 30. If wiper 40 is moved upwardly, then the delay is shortened. If wiper 40 is moved downwardly, there is a longer timed delay until output 38 transitions. Potentiometer 30 is preferably connected to reference input terminal 34 through a voltage divider network provided by resistors 44 and 46, which may include protective bypass capacitor 48.

When output 38 transitions low, both inputs to NOR gate 58 are low, and thus the gate output goes high. This high state clocks flip-flop 24, which has its D input tied high, and thus its Q output goes high as shown at transition 52, FIG. 2. The length of the timed ON delay 54 is determined by the variable charging rate of RC means 16, 17 and the variable threshold reference voltage at terminal 34, as set by potentiometer 30.

When the input signal transitions low at 56, FIG. 2, FET 22 in the lower OFF delay circuit is rendered nonconductive. This allows capacitor 19 to charge through resistor 18 from potentiometer 58. Comparator 6 comprises an operational amplifier 60 comparable to op amp 32, but having its plus terminal as the comparing input terminal 62, and its minus terminal as the reference input terminal 64. Potentiometer 58 includes a wiper 66 and a variable pot resistor 68, and is connected through a voltage divider network formed by resistors 70 and 71 to the reference input terminal 64, and may include a protective bypass capacitor 72, similarly to comparator timer 4. When the voltage at comparing input terminal 62 rises above that at reference input terminal 64, output 74 goes high. The timed delay is controlled by the setting of potentiometer 58.

When output 74 transitions high, the upper input to NOR gate 76 goes high. The output of NOR gate 76 thus goes low. This low state is provided at both inputs to NOR gate 78, whereby the latter's output goes high. This high state resets flip-flop 24 such that its Q output at 10 goes low, as shown at transition 80, FIG. 2. Timed OFF delay 82 is controlled by potentiometer 58, as described.

Initialization circuit 84 is provided to insure that output 10 is low at start-up. At power turn-on, point 86 is initially high as capacitor 88 charges. The initial high state of point 86 provides a high state to the lower input of NOR gate 76 such that the latter's output is low, and hence the output of NOR gate 78 is high to thus reset flip-flop 24 at turn-on. After turn-on, when capacitor 88 is charged, point 86 is tied low through resistor 90 such that the lower input to NOR gate 76 is low. NOR gate 76 thus follows its upper input from output 74 of the comparator timer.

If the input signal transitions high at 92, the timed ON delay is begun by comparator timer 4 and the upper half of the circuit. If the input signal transitions low at 94 before the end of the timed ON delay, then the ON delay timing is immediately terminated. When the input signal on line 8 transitions low or OFF at 94, both inputs to NOR gate 14 are low, whereby the output of the gate is high to thus render FET 20 conductive. Conduction of FET 20 discharges capacitor 17. This prevents voltage build-up at comparing input terminal 36, whereby the voltage at terminal 36 will not rise above that at terminal 34, and output 38 thus stays high and will not transition low.

The transition 94 of the input signal to OFF renders FET 22 in the lower half of the circuit nonconductive, thus allowing charging of capacitor 19 and the beginning of the OFF delay timing of comparator 6. If the input signal again transitions high or ON at 96 before the end of the timed OFF delay, then the OFF delay timing is immediately terminated, due to conduction of FET 20 and discharge of capacitor 19, and the ON delay timing is reset and initiated again. As seen in FIG. 2, there is no further transition of the input signal before the end of the timed ON delay 97, and the delay between transitions 96 and 98 is the same length as delay 54.

If the input signal transitions OFF at 102, then transitions ON at 104, and the transitions back OFF again at 106, the OFF delay timing is reset at 106 independently of any ON delay timing initiated at 104. The timed OFF delay 107 between transitions 106 and 108 is the same length at delay 82.

When the output signal at 10 is high, this high state is fed back on line 110 to the upper input of NOR gate 14 to thus keep the latter's output low, which ensures nonconduction of FET 20. The charged condition of capacitor 17 is thus maintained, and the voltage at comparing input terminal 36 remains above that at reference input terminal 34, whereby output 38 remains low, and the output of gate 50 remains high, which in turn prevents a transition of the clock signal to flip-flop 24. The ON delay portion of the circuit is thus inhibited because the clock signal to flipflop 24 cannot transition. Flip-flop 24 is clocked by the rising edge of the clock signal. As long as the output at 10 remains high, comparator 4 and the ON delay portion of the circuit is inhibited, and can only be re-enabled after the output on 10 has gone low, which in turn requires the input signal to transition low or OFF followed by the given timed OFF delay.

In the implemented embodiment, both delays are adjustable from about 0.1 second to about 25 seconds. The op amps used are ICL7631 configured for 10 microampere bias current. Gate 50 is used to speed up the rise time or fall time of output 38 so as to guarantee a solid clock pulse at flip-flop 24. Capacitors 17 and 19 are 4.7 microfarads, resistors 16 and 18 are 200 kilo ohms, pot resistors 42 and 68 are 2 megohms end to end, resistors 44 and 70 are 33 kilo ohms, resistors 46 and 71 are 200 kilo ohms, capacitors 48 and 72 are 0.01 microfarad, capacitor 88 is 0.1 microfarad, and resistor 90 is 100 kilo ohms. With trimmers 42 and 68 set at their midpoint, i.e. approximately 1 megohm on either side of the wiper, the power supply current drain is at a minimum of about 35 microamperes. Power supply current drain will be maximum at the trimmer end points. This current is well under 100 microamps. The timing range may be changed to about 0.01 to 2.5 seconds by changing capacitors 17 and 19 to 0.47 microfarad.

It is recognized that various modifications are possible within the scope of the appended claims.

I claim:

1. An ON/OFF delay circuit comprising:
   first and second comparator timers responsive to an input signal and providing respective ON and OFF delays of an output signal; and
   means for resetting said first and second comparator timers independently of each other such that each respective ON or OFF delay function may begin retiming without waiting for the other delay function if said input signal changes states before the end of the respective ON or OFF delay;
   wherein:
   an input ON signal initiates ON delay,
   if said input signal changes OFF before the end of said ON delay, said output remains OFF, and
   when said input signal changes back ON, said ON delay begins retiming without waiting for the OFF delay;
   an input OFF signal initiates OFF delay,
   if said input signal changes ON before the end of said OFF delay, said output remains ON, and
   when said input signal changes back OFF, said OFF delay begins retiming without waiting for the ON delay.

2. The invention according to claim 1 wherein each of said comparator timers includes RC means, and said resetting means comprise first and second switch means responsive to said input signal for enabling and disabling charging of respective capacitors of said RC means, and comprising output gate means responsive to said comparator timers and outputting said output signal.

3. The invention according to claim 2 wherein said first switch means further includes input gate means responsive to said input signal and to said output signal for controlling said first switch means to enable or disable charging of said capacitor of said first RC means.

4. The invention according to claim 3 wherein said output gate means comprises flip-flop means.

5. An ON/OFF delay circuit comprising:
   a first comparator timer having a reference input terminal and a comparing input terminal, and having an output whose state is determined by the state of said comparing input terminal relative to said reference input terminal;

first RC means in circuit with said first comparator;

first switch means in circuit with said first RC means and responsive to an input signal for enabling or disabling charging of the capacitor of said first RC means, in the enabled mode, the charging of said capacitor of said first RC means causes voltage to rise at said comparing input terminal such that said output of said first comparator transitions from one state to another when the voltage at said comparing input terminal rises in a given polarity direction above that at said reference input terminal after a given ON delay, in the disabled mode, said capacitor of said first RC means remains uncharged such that the voltage at said comparing input terminal does not rise above that at said reference terminal, and the output of said first comparator remains in said one state;

output gate means responsive to said transition of said first comparator output from said one to said other state, to yield an output signal transitioning from a first to a second state;

a second comparator having a reference input terminal and a comparing input terminal, and having an output whose state is determined by the state of its said comparing input terminal relative to its said reference input terminal;

second RC charging means in circuit with said second comparator;

second switch means in circuit with said second RC means and responsive to said input signal for enabling or disabling charging of the capacitor of said second RC means, in the enabled mode, the charging of said capacitor of said second RC means causes voltage to rise at said comparing input terminal of said second comparator such that said output of said second comparator transitions from one state to another after a given OFF delay when the voltage at said comparing input terminal of said second comparator rises in a given polarity direction above that at said reference input terminal of said second comparator, in the disable mode, said capacitor of said second RC means remains uncharged such that the voltage at said comparing input terminal of said second comparator does not rise above that at said reference input terminal of said second comparator, and the output of said second comparator remains in a given state without transition;

said output gate means being responsive to said transition of said second comparator to yield said output signal transitioning from said second to said first state.

6. The invention according to claim 5 wherein said input signal has a first state enabling charging of said capacitor of said second RC means, and a second state enabling charging of said capacitor of said first RC means.

7. The invention according to claim 6 comprising an input gate responsive to said input signal and to said output signal, and controlling said first switch means.

8. The invention according to claim 7 wherein said output gate comprises flip-flop means.

9. The invention according to claim 8 comprising initialization gate means connected between said second comparator and said flip-flop means for resetting said flip-flop means to said first state upon start-up.

10. The invention according to claim 9 wherein said initialization gate means comprises a capacitor initially charging a reference point to a given polarity upon start-up, and a resistor referencing said reference point to the opposite polarity after start-up and charging of said capacitor.

11. The invention according to claim 10 wherein said initialization gate means further comprises OR gate means having one input from said reference point and the other input from said second comparator, and having and output to said flip-flop means.

12. The invention according to claim 8 wherein each of said switch means comprises a field effect transistor in parallel with the capacitor of its respective said RC means such that when the FET is nonconductive the RC means is in the enabled mode and the capacitor charges, and such that when the FET is conductive the RC means is in the disabled mode and the FET rapidly discharges its respective capacitor.

13. The invention according to claim 8 further comprising gate means between said first comparator and said flip-flop and providing a solid clock pulse to the latter.

14. The invention according to claim 8 wherein each said comparator includes potentiometer means comprising a voltage source connected through a wiper to a variable point along a pot resistor, the lower end of said pot resistor being connected to said reference threshold terminal of its respective comparator, the upper end of said pot resistor being connected through said RC means to said comparing input terminal of its respective comparator, such that when said wiper is moved downwardly, the threshold trip voltage at the reference input terminal is increased, and the charging current to the capacitor of said RC means is decreased, such that it takes longer for the voltage at the comparing input terminal to rise above the voltage at the reference terminal, and such that when said wiper is moved upwardly, the threshold trip voltage at the reference input terminal is decreased, and the charging current to the capacitor of said RC means is increased, such that it takes less time for the voltage at the comparing input terminal to rise above the voltage at the reference input terminal.

15. The invention according to claim 6 wherein each said switch means has a first state enabling charging of its respective said capacitor of said means, and has a second state providing rapid discharge of its respective said capacitor of said RC means to afford resetting of the delay timing function of said first and second RC means and comparator means independently of each other such that each respective delay function may begin retiming without waiting for the other delay function if said input signal changes states before the end of the respective delay.

16. The invention according to claim 15 wherein:

transition of said input signal from said second to said first state is an input ON signal, and transition from said first to said second state is an input OFF signal;

said input ON signal initiates ON delay, if said input signal changes OFF before the end of said ON delay, said output remains OFF, and when said input signal changes back ON, said ON delay begins retiming without waiting for the OFF delay, regardless of whether the OFF delay time has expired;

said input OFF signal initiates OFF delay,
   if said input signal changes ON before the end of said OFF delay, said output remains ON, and
   when said input signal changes back OFF, said OFF delay begins retiming without waiting for the ON delay, regardless of whether the ON delay time has expired.

17. A proximity switch ON/OFF delay circuit comprising:
   a first comparator timer having a reference input terminal and a comparing input terminal, and having an output whose state is determined by the state of said comparing input terminal relative to said reference input terminal;
   first RC means in circuit with said first comparator;
   first switch means in circuit with said first RC means and responsive to an input signal for enabling or disabling charging of the capacitor of said first RC means,
   in the enabled mode, the charging of said capacitor of said first RC means causes voltage to rise at said comparing input terminal such that said output of said first comparator transitions from one state to another when the voltage at said comparing input terminal rises in a given polarity direction above that at said reference input terminal after a given ON delay,
   in the disabled mode, said capacitor of said first RC means remains uncharged such that the voltage at said comparing input terminal does not rise above that at said reference terminal, and the output of said first comparator remains in said one state;
   output gate means responsive to said transition of said first comparator output from said one to said other state, to yield an output signal transitioning from a first to a second state;
   a second comparator having a reference input terminal and a comparing input terminal, and having an output whose state is determined by the state of its said comparing input terminal relative to its said reference input terminal;
   second RC charging means in circuit with said second comparator;
   second switch means in circuit with said second RC means and responsive to said input signal for enabling or disabling charging of the capacitor of said second RC means,
   in the enabled mode, the charging of said capacitor of said second RC means causes voltage to rise at said comparing input terminal of said second comparator such that said output of said second comparator transitions from one state to another after a given OFF delay when the voltage at said comparing input terminal of said second comparator rises in a given polarity direction above that at said reference input terminal of said second comparator,
   in the disable mode, said capacitor of said second RC means remains uncharged such that the voltage at said comparing input terminal of said second comparator does not rise above that at said reference input terminal of said second comparator, and the output of said second comparator remains in a given state without transition;
   said output gate means being responsive to said transition of said second comparator to yield said output signal transitioning from said second to said first state.

* * * * *